(12) United States Patent
Edwards

(10) Patent No.: US 7,190,225 B2
(45) Date of Patent: Mar. 13, 2007

(54) EFFICIENT LOW EMI SWITCHING OUTPUT STAGES AND METHODS

(75) Inventor: Christopher Francis Edwards, Sunnyvale, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 31 days.

(21) Appl. No.: 10/948,586

(22) Filed: Sep. 23, 2004

(65) Prior Publication Data

US 2006/0061419 A1    Mar. 23, 2006

(51) Int. Cl.
*H03F 3/217* (2006.01)
(52) U.S. Cl. ............... 330/251; 330/264; 330/207 A
(58) Field of Classification Search ............ 330/251, 330/264, 207 A, 207 P
See application file for complete search history.

(56) References Cited

U.S. PATENT DOCUMENTS

| | | | | |
|---|---|---|---|---|
| 4,337,423 | A * | 6/1982 | Giordano | 318/280 |
| 5,479,337 | A * | 12/1995 | Voigt | 363/131 |
| 5,930,132 | A * | 7/1999 | Watanabe et al. | 363/56.04 |
| 5,973,368 | A * | 10/1999 | Pearce et al. | 257/368 |
| 6,215,253 | B1 * | 4/2001 | Ribarich et al. | 315/224 |
| 6,229,288 | B1 * | 5/2001 | Baretich et al. | 323/223 |
| 6,362,683 | B1 * | 3/2002 | Miao et al. | 330/10 |
| 6,819,177 | B2 * | 11/2004 | Ruha et al. | 330/207 A |
| 6,995,987 | B2 * | 2/2006 | Song et al. | 363/17 |
| 7,034,609 | B2 * | 4/2006 | Risbo et al. | 330/10 |

OTHER PUBLICATIONS

Monticelli, Dennis M., "A Quad CMOS Single-Supply Op Amp with Rail-to-Rail Output Swing", IEEE Journal of Solid-State Circuits, Dec. 1986, pp. 1026-1034, vol. SC-21, No. 6.

* cited by examiner

*Primary Examiner*—Patricia Nguyen
(74) *Attorney, Agent, or Firm*—Blakely Sokoloff Taylor & Zafman LLP

(57) ABSTRACT

Efficient low EMI switching output stages and methods that may be used, by way of example, in class D amplifiers. The output stages comprise class AB output stages having complementary FETs for the output. The FETs are switched in response to a switch control signal in a manner to simultaneously switch the FETs so that both FETs are not off at the same time. The extent to which both FETs are on at the same time is controlled to maintain efficiency of the circuit, and preferably the output voltage slew rate is set by circuit parameters to a relatively low slew rate. By maintaining conduction in one or both the FETs during the transition, forced conduction through a parasitic diode in either FET, as may occur in response to an inductive load (an effect commonly called freewheeling), together with the rapid and wide voltage swing associated therewith, is avoided. The removal of dead time (time when all switches are OFF), and associated freewheeling behavior, enables a controlled reduction in the output voltage slew rate and grossly reduces EMI emissions. The invention is particularly useful for switching power level outputs, and/or where lead wires or substantial circuit traces may be connected thereto.

31 Claims, 7 Drawing Sheets

EFFICIENT LOW EMI SWITCHING OUTPUT STAGES AND METHODS

BACKGROUND OF THE INVENTION

1. Field of the Invention

The present invention relates to the field of electromagnetic interference (EMI) control in complementary FET switching circuits.

2. Prior Art

Electromagnetic Interference (EMI) is a common problem in modern electronic systems. Many everyday consumer products combine complex digital signal processing with radio frequency transmit and receive circuitry for communication. The former is an unintentional source of EMI that can interfere with the latter "intentional" source, as well as any other RF sources in the vicinity of the emitter. As a result, there exists stringent high frequency emissions limits on most everyday electronic equipment.

As one example, for class D amplifiers, the fast switching of the output FETs can cause strong emissions at high frequencies. For filterless class D amplifiers, the magnitude of the emissions is a strong function of the length of the wires connecting the amplifier to the speaker. Since the speaker presents an inductive load to the amplifier, the rate of change of the electric field is usually much higher than the rate of change of the magnetic field around the emitter. Therefore, the high frequency characteristics of the output switching voltage waveform mostly determine the EMI performance. There are essentially two components to this waveform: (1) the transition from negative supply to positive supply and vice versa, and (2) the ringing and settling due to various parasitic LC tank circuits around the power FETs and their packaging. To fully understand the details here, refer to FIG. 1 and note that, for an inductive load, current cannot change instantaneously in the inductor, and therefore, when both devices are OFF, current must continue to flow somewhere, and can therefore only flow through the FET parasitic diodes. Depending on the direction of the load current, the parasitic diode could either cause the output to transition to a diode drop above the positive supply rail, or a diode-drop below the negative supply rail. When one or the other of the FETs is subsequently turned ON, the load current flows through the FET, causing the output voltage to either droop toward the nearest supply rail, or to transition to the opposite supply rail.

The ringing and settling depend on the distributed LC tank circuits that include package and bond-wire inductance and parasitic FET capacitances. For example, assume for discussion that the output FET gate series resistors shown in FIG. 1 are zero. Every time the gate of one of the output FETs is switched to the supply rail, an LC tank is formed from the supply line inductance and FET gate-source and gate-drain capacitances, damped only by the ON resistance of a switch, which might only be a few ohms. The FET gate voltage can ring with a frequency of 100 s of MHz, an oscillation which will couple through to the output. This can easily be visible in the output voltage spectrum as an emissions spike at the LC tank frequency. Depending on which way the output is transitioning, and the direction of the load current, various LC tank frequencies can be observed.

The slew rate of the output transition from low to high and vice versa determines how much the wideband frequency content of the output voltage deviates from that of an ideal square waveform. For example, the frequency spectrum of a square pulse with equal and finite rise and fall times $\tau$ will exhibit harmonics that follow a sinc (sin x/x) envelope when compared to the frequency spectrum of an ideal square waveform (ideal being one with infinitely fast edges). This sinc envelope has spectral nulls at frequencies that are integer multiples of $1/\tau$. Making $\tau$ be 10 ns or greater under all operating conditions can therefore result in a significant emissions benefit.

Therefore it is desired that the gate voltage transitions of both FETs be controlled in such a way as to limit the output voltage slew rate, and attempt to damp the described parasitic sources of oscillation. Referring to FIG. 1, conventional means to achieve this involve either adding resistors in series with the output FET gates, or reducing the aspect ratio of the output FET gate driving switches to increase the RC time constant formed by the gate and the driving switch. Both solutions increase the transition time of the output FET gates, but the time between one FET turning OFF and the next FET turning ON is relatively poorly controlled, and will typically lead to substantial dead time (time when both switches are OFF) as shown in the typical waveforms of FIG. 2. Furthermore, for an inductive load (see FIG. 2), the point at which the output voltage transition occurs is also poorly controlled, and in fact, can occur either at the beginning or end of the dead time, depending on the direction of the load current. (Note that the direction of the load current determines which one of the parasitic FET diodes must conduct during the dead time.) This effect results in distortion. The time used for FET gate transitions leads to efficiency loss, because the FETs are operating in a high ON resistance mode for a relatively large fraction of the switching period. Finally, these shortcomings limit the maximum frequency of operation of the output power stage, and this is in itself largely contrary to high fidelity and high efficiency filterless class D circuit design art.

The foregoing discusses the prior art as related to class D amplifiers such as are frequently used to drive a speaker. However similar problems are encountered in any application that uses two or more complementary FETs as a switched output stage to drive heavy loads, including resistive, capacitive, inductive and complex loads in response to an input signal. In that regard, such circuits are considered herein, in a broad sense, as a form of class D amplifier.

Furthermore, for illustrative purposes, schematics of the prior art and disclosed invention show a single-ended speaker driver configuration. It should be noted that the invention can be readily applied to a full H-bridge load configuration, as is more common in the class D art. Considering the single-ended case merely simplifies the foregoing discussion.

DETAILED DESCRIPTION OF THE PREFERRED EMBODIMENTS

Figure 3:
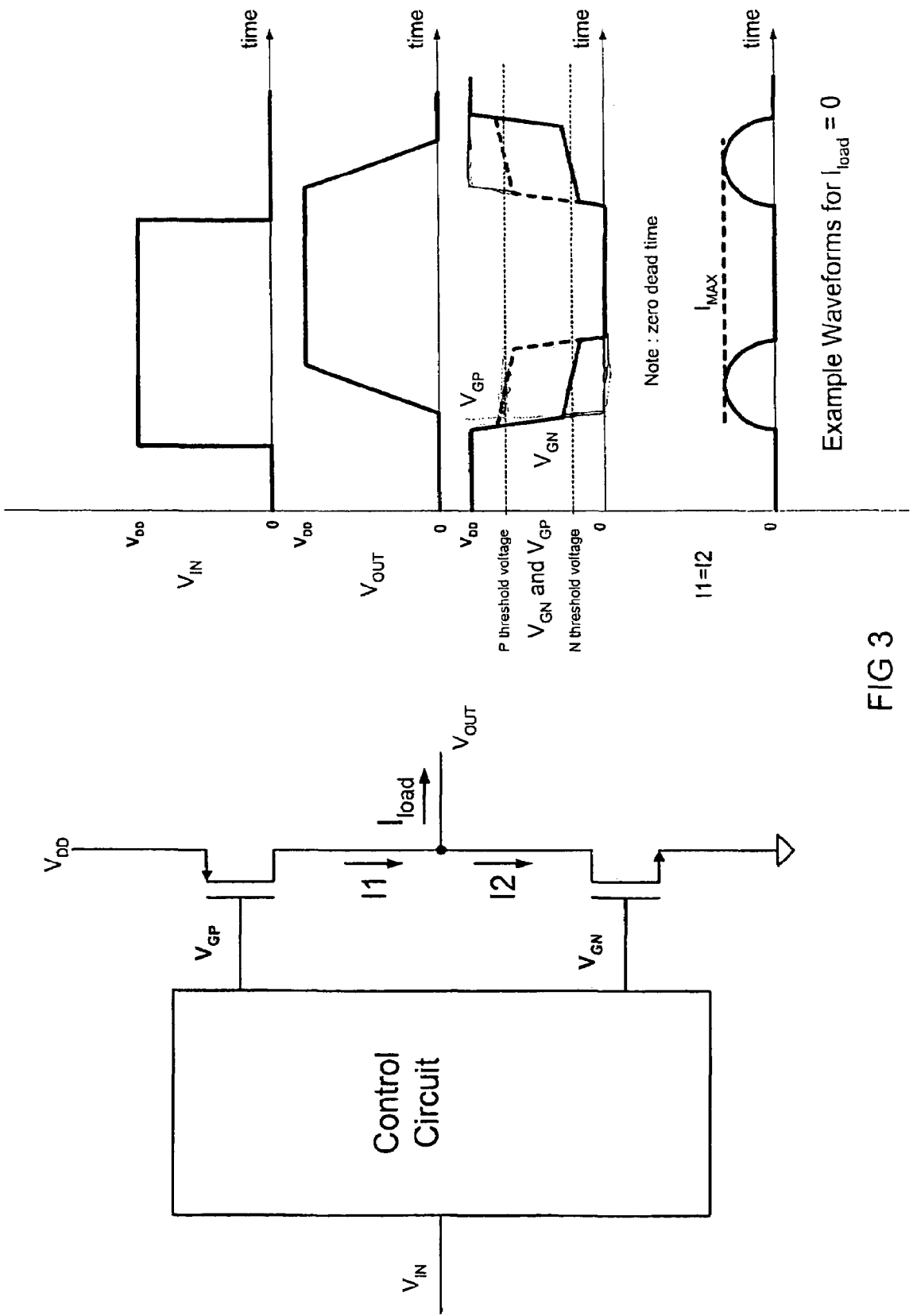
FIG. 3 is a schematic diagram of the present invention with exemplary waveforms illustrating the principles of operation thereof.

The present invention, among other things, has two main characteristics that offer improvement over the prior art. These may be illustrated in relation to FIG. 3. As shown therein, a control circuit receives an input switching signal $V_{IN}$ and provides gate controls for complementary FETs providing a load current $I_{load}$ at an output voltage $V_{OUT}$, in this example to a speaker as a load. In the primary examples provided herein, the complementary FETs are n channel and p channel FETS, though this is not a limitation of the invention. For purposes of specificity in this example, assume that the load current is zero, and that at time $t_0$, the input voltage $V_{IN}$ changes from 0 to $V_{DD}$, signaling that the n channel device should be turned off ($V_{GN}$ should go low) and that the p channel device should be turned on ($V_{GP}$ should also go low). While both of the gate control voltages $Y_{GP}$ and $V_{GN}$ should go low, it may be seen that the gate control voltages $V_{GP}$ and $V_{GN}$ are controlled in a coordinated manner so that they essentially simultaneously cross the threshold voltage of the respective FET. Thus both FETs are not off at the same time, and in fact, are both somewhat turned on during the transition through the threshold voltages, giving rise to a current from $V_{DD}$ to ground (I1=I2) during the transition that peaks at a value $I_{MAX}$. For simplicity, the effect of parasitic capacitance at the output is ignored in the exemplary waveforms. In practice, I1 and I2 will differ during the transition by an amount sufficient to charge this parasitic capacitance. This fact doesn't affect the foregoing analysis.

The advantages of this approach include:

(1) Zero dead time. The output FET gates are switched simultaneously (and not sequentially). This provides the ability to reduce the output voltage slew rate with minimal periods of time where efficiency is reduced (those periods being the dead time and gate voltage transition time). The output voltage transition point is better controlled. The parasitic FET diodes do not conduct and cause distortion.

(2) The control circuit controls the gate voltages to allow a limited crowbar (both devices ON) current, $I_{max}$, in transition. This prevents very large crowbar switching currents that would otherwise occur when switching the gates simultaneously, and which can lead to excessive static (no load) power dissipation and/or could destroy the devices. Thus, a high efficiency is maintained.

Figure 4:
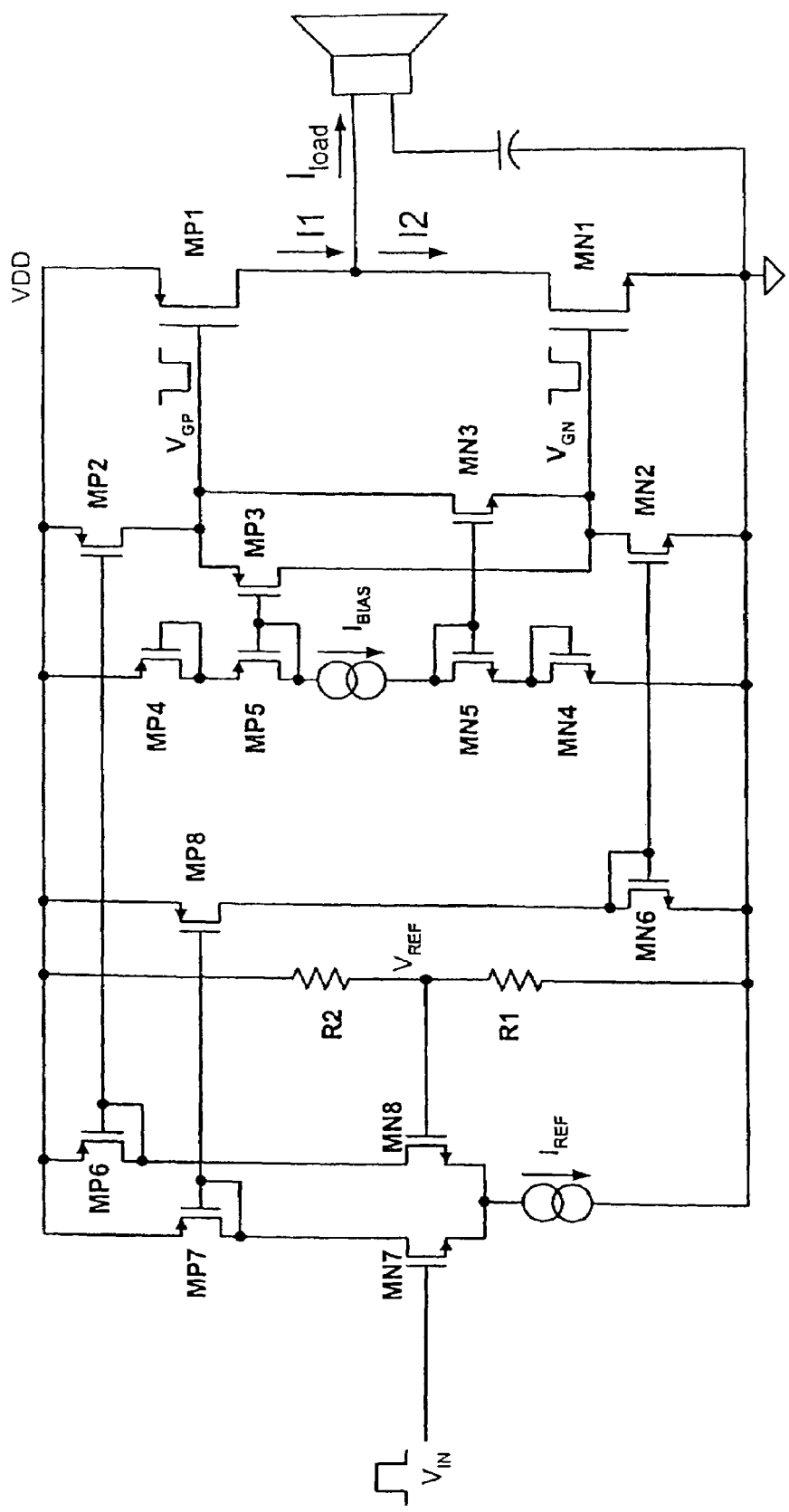
FIG. 4 is a circuit diagram of an exemplary embodiment of the present invention.

FIG. 4 shows a preferred embodiment of the invention. The crowbar control circuit consists of a MOSFET translinear circuit (MN1-5, MP1-5) that is commonly used in class AB amplifiers as a quiescent current control circuit. When used as a digital switching stage in this application, the circuit exhibits the characteristics listed above, and operates as follows.

Figure 5:
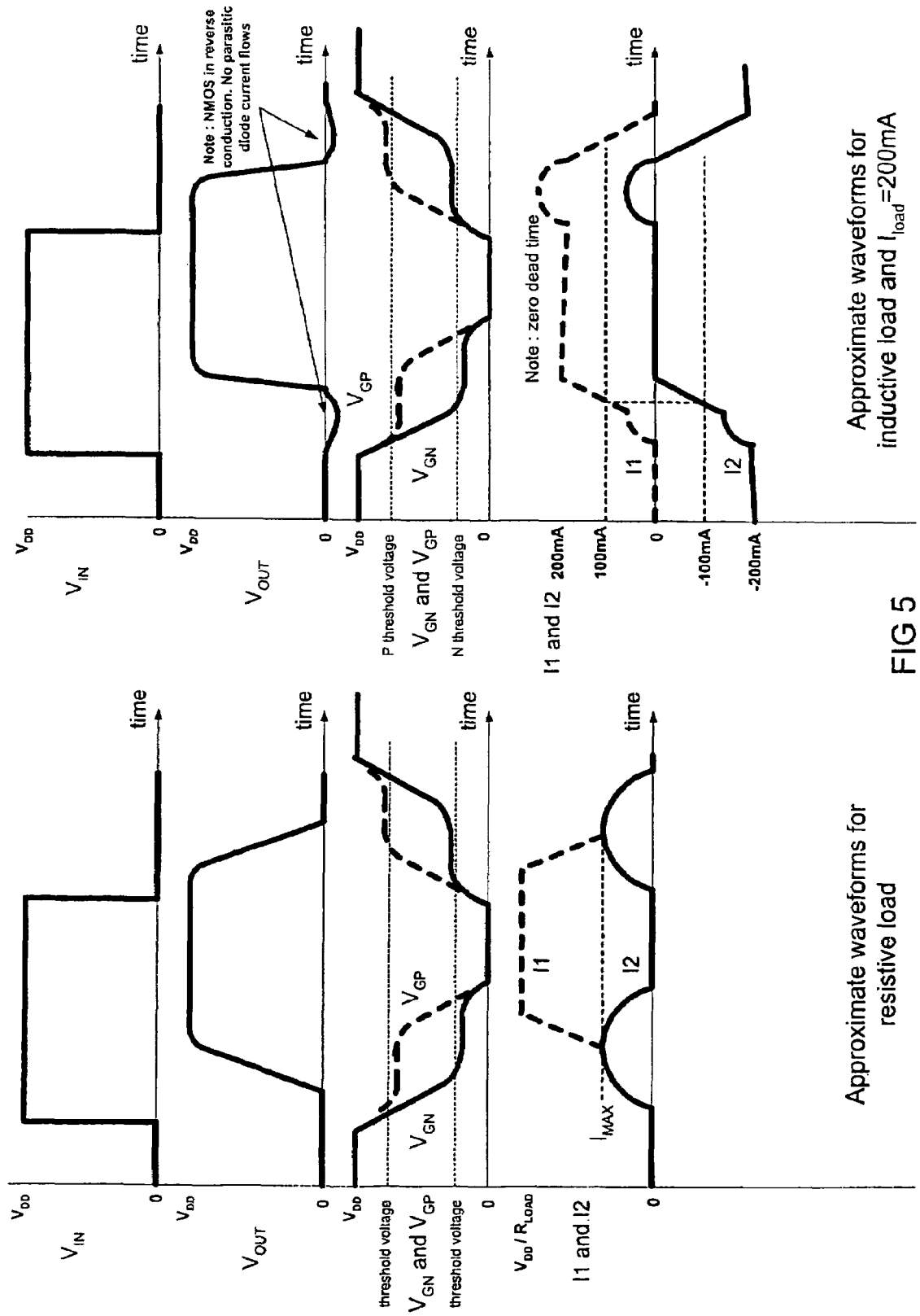
FIG. 5 presents exemplary waveforms for the embodiment of FIG. 4.

Consider the low-to-high output transition illustrated in the exemplary waveforms of FIG. 5. When $V_{IN}$ goes from low to high, current Iref is steered through current mirrors MP7/MP8 and MN6/MN2. Initially, MP2 has no current. Both gate voltages $V_{GP}$ and $V_{GN}$ are high. MP3 is ON and operating in its triode region (Vds~0), which means that $V_{GP}$ and $V_{GN}$ must track each other. Note that MN3 is OFF and so $I_{MN2}=I_{MP3}$, and note that this current flows from the gate of MP1, charging it's gate capacitance. $V_{GP}$ will decrease until roughly a threshold voltage below $V_{DD}$, such that MP3 satisfies the PMOS triode region equation $I_{MP3}=(KW/L)*(Vsg-Vth-Vsd/2)*Vsd$, where K is the mobility times oxide capacitance per unit area product, and where W and L are the transistor width and length and Vth is the absolute value of the threshold voltage. At this point, $V_{GP}$ will stay roughly constant, and $I_{MP3}$ must then decrease to reflect the decrease in the rate of change of $V_{GP}$. Most of $I_{MN2}$ now flows through the gate of MN1, thus further discharging $V_{GN}$, but at a faster rate. $V_{GN}$ then continues to decrease until MN3 turns ON at roughly a threshold voltage above ground. MN3 will then start to conduct the current $I_{MN2}$ and $V_{GN}$ will be held roughly constant. MN3's current flows through the gate capacitance of MP1, causing $V_{GP}$ to decrease at a rate given approximately by $dV_{GP}/dt=-I_{MN2}/C_{g\,(MP1)}$. As the voltage $V_{GP}$ approaches the voltage $V_{GN}$, MN3 enters the triode region, which causes $V_{GN}$ to track $V_{GP}$ again. $V_{GN}$ will continue to decrease so as to satisfy the NMOS triode region equation $I_{MN3}=(KW/L)*(Vgs-Vth-Vds/2)*Vds$, where Vds is gradually decreasing, and so Vgs must be increasing. $V_{GP}$ and $V_{GN}$ continue reducing until MN2 shuts off when its Vds becomes zero.

Note that at no point during this cycle are MP3 and MN3 both OFF (Vgs<Vth for both transistors). Therefore, either the translinear circuit MP1-5 or the translinear circuit MN1-MN5 is controlling the current I1 and I2 when Iload=0. In the region when $I_{MN2}=I_{MP3}$, $I_{max}$ can be written as $I_{max}=\beta_{MP1}[\sqrt{(I_{BIAS}/\beta_{MP4})}+\sqrt{(I_{BIAS}/\beta_{MP5})}-\sqrt{(I_{REF}/\beta_{MP3})}]^2$, where $$\beta_{MPn}=(KW/2L)_{Mpn}$$

In the region when $I_{MN2}=I_{MN3}$, $I_{max}$ can be written as $I_{max}=\beta_{MN1}[\sqrt{(I_{BIAS}/\beta_{MN4})}+\sqrt{(I_{BIAS}/\beta_{MN5})}-\sqrt{(I_{REF}/\beta_{MN3})}]^2$, where $$\beta_{MNn}=(KW/2L)_{MNn}$$

Thus, at all times during the transition, $I_{max}$ is well controlled, as the extent to which both MP1 and MN1 are partially on at the same time is well controlled.

The output slew rate is now controllable by varying $I_{BIAS}$, $I_{REF}$ and the transistor aspect ratios, since $|dV_{OUT}/dt|<=I_{max}/C_{out}$, where $C_{out}$ is the sum of the output FET (MN1/MP1) drain capacitances, which would be well known, plus any additional loading capacitance, which would typically be small compared to that of the FETS.

Referring now to FIG. 5, the behavior of the circuit with both a resistive and inductive load can be compared with that of the prior art. In particular, the behavior of the gate voltages is approximately independent of the load, and it can be noted that, for an inductive load, there is no dead time where both output FETs are OFF and, as a result, the FET parasitic diodes do not carry current. Note that the reverse conducting mode of the NMOS transistor during the gate transition ($V_{GN}$ getting smaller) can cause the output voltage to droop by 100–300 mV below ground, but this droop is too small to cause the MOS parasitic diode to turn on. The load current therefore traverses from MN1 to MP1 as MOS channel current only.

Figure 1:
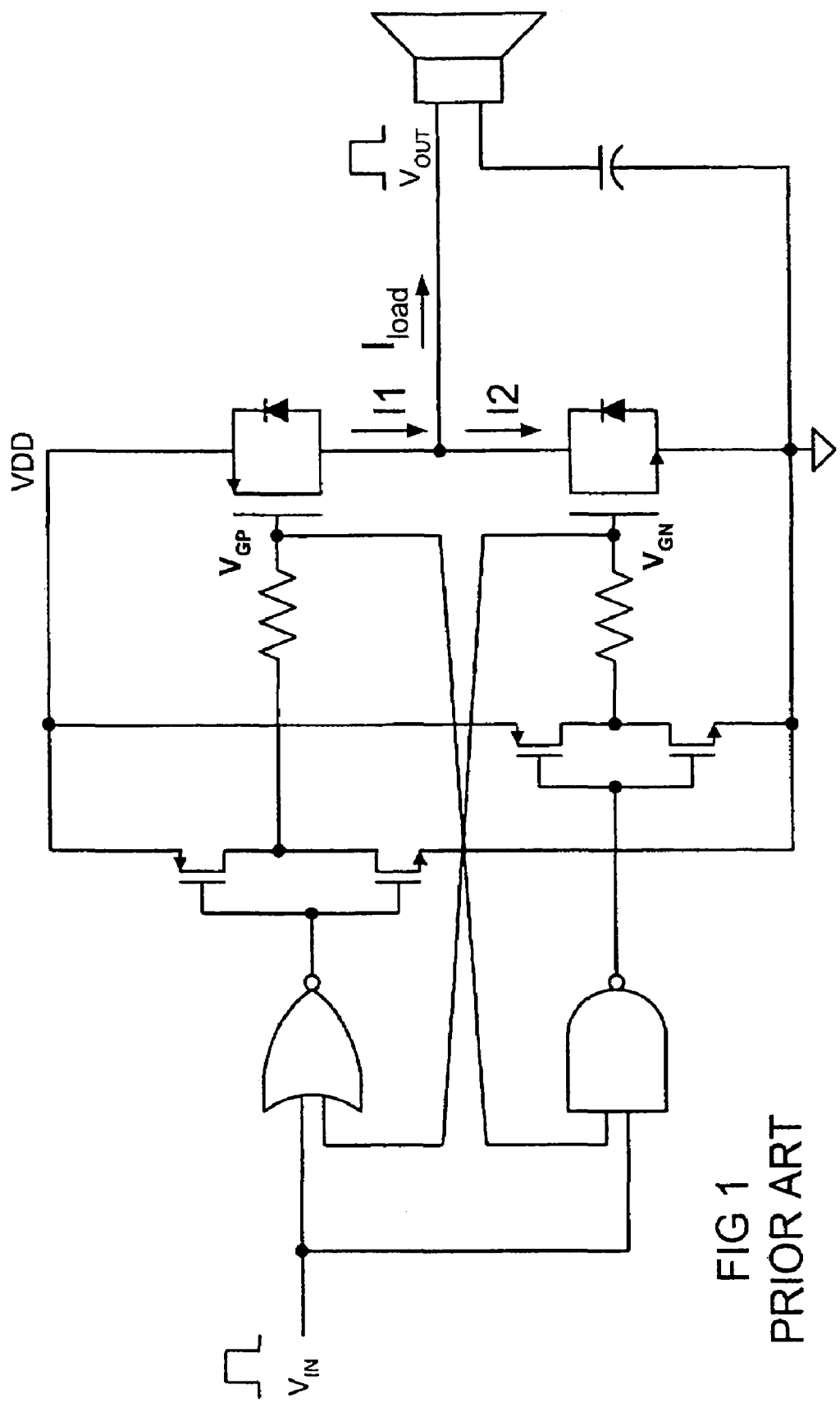
FIG. 1 is a diagram illustrating a typical prior art class D amplifier driving a speaker and using parasitic diode conduction during the period both output FETs are turned off.
Figure 2:
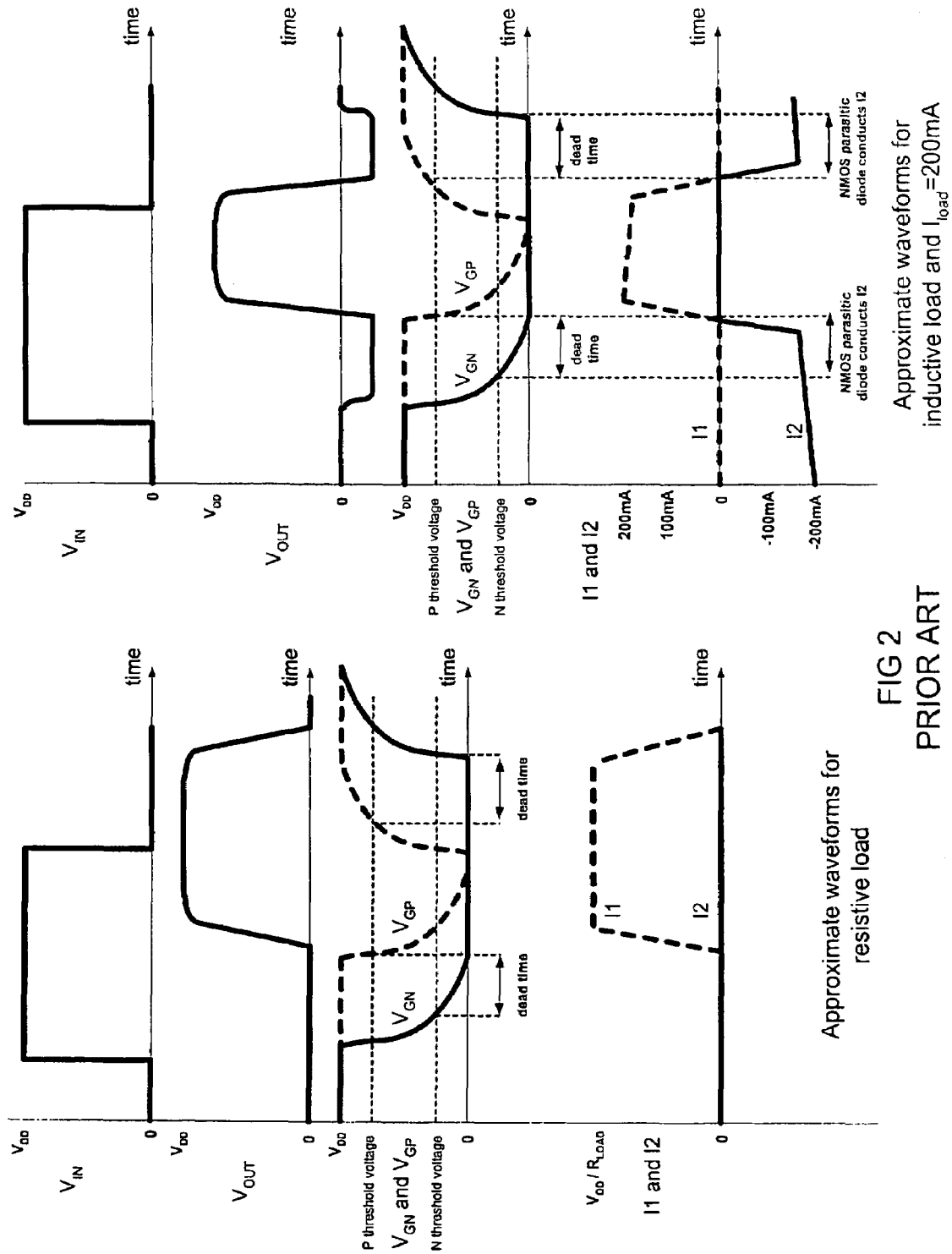
FIG. 2 presents waveforms characteristic of the prior art.

For the class D audio application, the implication of this behavior is profound. Most importantly, it means that the output voltage transitions can be completely controlled by the FET gate voltages in the presence of an inductive load such as a speaker. Compare this with the prior art of FIGS. 1 and 2 in response to an inductive load, and note that the output high-to-low transition in response to the same input signal condition occurs at the point of turn OFF of the P channel FET. The output slew rate is therefore not only very large, but highly load-dependent and also dependent on the speaker. DC impedance. This is because $dV_{out}/dt=-I_{load}/Cout$, where $I_{load}$ would usually be much greater than $I_{max}$. For example, in a typical application, $I_{load}>1A$ for a 4 ohm speaker with $V_{DD}$=5V. Compare this with a controlled $I_{max}$ in the range of 30 mA, and it is clear that the output slew rate of the present invention can be designed to be much lower, independent of the load, and correspondingly much better emissions performance can be achieved with the described invention. In that regard, while the slew rates on $V_{OUT}$ appear as high in FIG. 5 as in the prior art of FIG. 2, these Figures are schematic only, the slew rate of the present invention being readily controllable and limited as described.

For example, in one embodiment of the invention, a 20 dB margin has been achieved under FCC class B EMI limits. Furthermore, an identical circuit but with a prior art switching power stage exhibits only 5 dB of margin. The maximum power efficiency is the same as the prior art realization. This is because the total time spent by the FET gates in transitioning between the supply rails is typically equal to less than 10% of the overall switch control signal period. This maximizes efficiency and frequency of operation and minimizes distortion. In this embodiment, the power stage operates at up to a 2 MHz switching frequency, which is typically 5–10 times faster than prior art slew-limited designs can safely operate. The transition time of a voltage on the output terminal is at least 10 ns under all operation conditions.

In the specific exemplary embodiment hereinbefore described, a specific class AB amplifier output stage has been used for purposes of explanation of the present invention and not for purposes of limitation of the invention. In particular, any class AB amplifier output stage having a provision for controlling the quiescent current may be used, though preferably one having a sufficiently high frequency response to allow achievement of the EMI reduction at the high switching rates readily achievable by the present invention. Thus in a broad sense, in one aspect, the present invention comprises an input stage that receives a switch control signal and a class AB output stage controlled by the input stage to switch complementary output FETs with a controlled slew rate and with a crowbar effect in the switching while controllably limiting the serial current through the output FETS during the time both output FETs are turned on. Typically the input signal will be a two state signal, or will be converted to one or more two state signals in the input stage.

In another aspect, the present invention comprises a switch control circuit for controlling the switching of complementary FET devices to limit the EMI generated by providing a controlled slew rate of the output voltage and by simultaneous switching of the FET devices to avoid any period during which both FET devices are turned off. Typically the FET devices will be power devices, and may be discrete or integrated devices. In that regard, the exemplary circuit disclosed herein is a fully integrated CMOS circuit, though the present invention may readily be implemented in a BiCMOS process if desired.

Figure 6A:
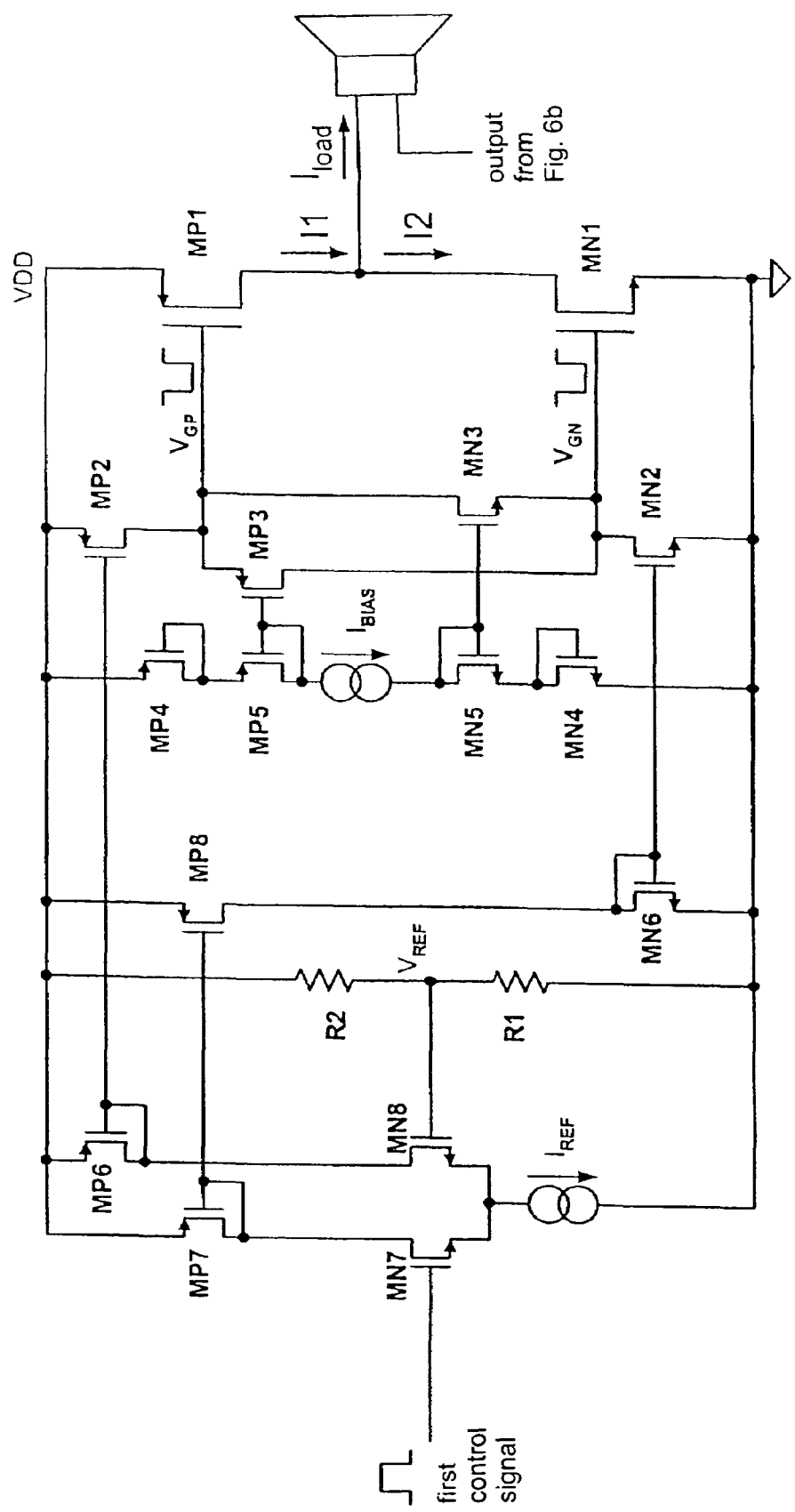
FIGS. 6a and 6b illustrate the application of the present invention to full H bridge circuits.
Figure 6B:
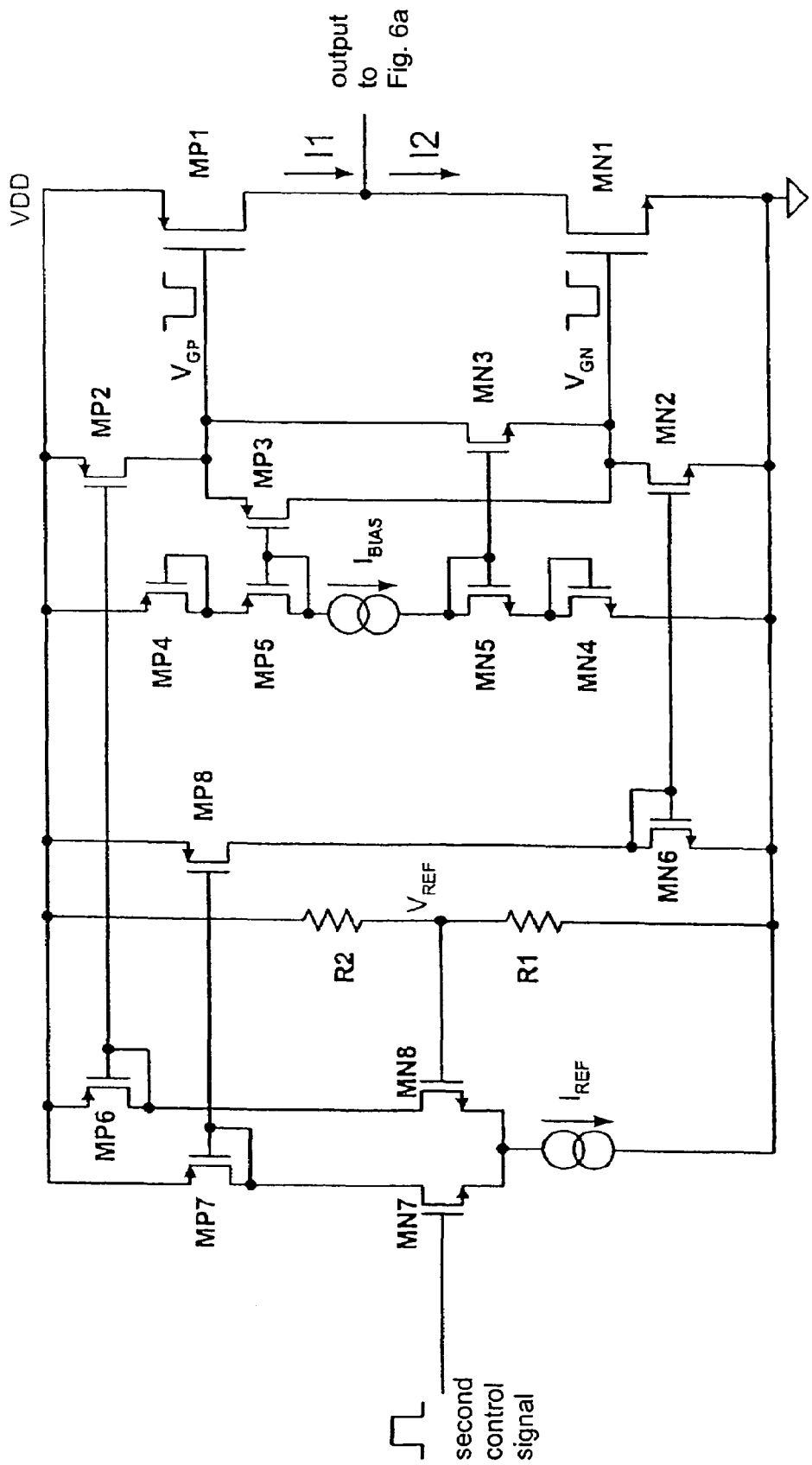

The control circuit and the complementary FETS being switched may comprise a class D amplifier, or may comprise a switching circuit for any complementary FETs, typically power FETS, to reduce the EMI generated during switching. While a single pair of complementary FETS are shown in the exemplary embodiment, the invention may readily be applied to the switching of multiple pairs of complementary FETS, such as, by way of example, full H bridge circuits as used in class D amplifiers and otherwise. This is illustrated in FIGS. 6a and 6b, wherein each circuit is controlled by a respective control signal, which control signals may or may not be complementary control signals.

This invention is particularly applicable to filterless class D audio amplifiers to enable ultra-low emissions performance. In particular, the present invention enables filterless EMI performance that is 20 dB or more below FCC class B radiated emissions standards. Unlike many conventional low EMI solutions, the invention is not accompanied by a large degradation in distortion, efficiency characteristics or reduced operating frequency. The present invention is applicable to any application that uses 2 or more complementary FETs as an output stage to drive heavy loads (either resistive, capacitive or inductive). For example, charge pump power supplies can use the circuit, as can I/O pin drivers in microprocessors or digital signal processors. Often, these circuits use crude means to limit output transition times and emissions, at the expense of efficiency and/or operating frequency.

While certain preferred embodiments of the present invention have been disclosed and described herein or purposes of illustration, it will be understood by those skilled in the art that various changes in form and detail may be made therein without departing from the spirit and scope of the invention.

What is claimed is:

1. A method of switching RET devices in response to a switch control signal in a switched output stage having a first FET device coupled between a first power supply terminal and an output terminal and a second FET device coupled between the output terminal and a second power supply terminal, each FET device being controlled by a voltage on a respective gate, comprising switching the gate voltages in response to the switch control signal so that as one FET device becomes partially turned off, the other FET device becomes partially turned on, providing a momentary current path between the first and second power supply terminals, wherein the current in the momentary current path is less than a current that may be delivered through the output terminal to a load connected thereto.

2. The method of claim 1 wherein the slew rate of a voltage on the output terminal is lower than the slew rate of the switch control signal.

3. The method of claim 2 wherein the slew rate of the voltage on the output terminal is determined by the parameters of a circuit responsive to the switch control signal to control the gates of the FET devices.

4. The method of claim 3 where the circuit responsive to the switch control signal controls the gates of the FET devices to have a transition time that is equal to or less than 10% of the period of the switch control signal.

5. The method of claim 2 wherein the parameters include a bias current and a reference current.

6. The method of claim 2 wherein a voltage on the output terminal has a transition time of at least 10 ns under all operating conditions.

7. A method of class D amplification comprising:
providing a switch control signal;
providing a first FET device coupled between a first power supply terminal and an output terminal;
providing a second FET device coupled between the output terminal and a second power supply terminal, each FET device being controlled by a voltage on a respective gate;
switching the gate voltages in response to the switch control signal so that as one FET device becomes partially turned off, the other FET device becomes partially turned on, providing a momentary current path between the first and second power supply terminals, wherein the current in the momentary current path is less than a current that may be delivered through the output terminal to a load connected thereto.

8. The method of claim 7 wherein the slew rate of a voltage on the output terminal is lower than the slew rate of the switch control signal.

9. The method of claim 8 wherein the slew rate of the voltage on the output terminal is determined by the parameters of a circuit responsive to the switch control signal to control the gates of the FET devices.

10. The method of claim 9 wherein the circuit responsive to the switch control signal controls the gates of the PET devices to have a transition time that is equal to or less than 10% of the period of the switch control signal.

11. The method of claim 8 wherein the parameters include a bias current and a reference current.

12. The method of claim 8 wherein a voltage on the output terminal has a transition time of at least 10 ns under all operating conditions.

13. The method of claim 7 wherein the method is practiced using an integrated circuit, and for an inductive load coupled to the output terminal, conduction is always through the FET devices and not through parasitic diodes intrinsic to the PET devices.

14. The method of claim 7 wherein the method is practiced using an integrated circuit, and for an inductive load coupled to the output terminal, conduction is always through the PET devices and not through diodes either internal or external to the integrated circuit.

15. The method of claim 7 further comprised of a speaker coupled to the output terminal.

16. A method of class D amplification comprising:
providing first and second switch control signals;
providing a first FET device coupled between a first power supply terminal and a first output terminal;
providing a second FET device coupled between the first output terminal and a second power supply terminal, the first and second FET devices being controlled by a voltage on their respective gates;
providing a third FET device coupled between the first power supply terminal and a second output terminal;
providing a fourth FET device coupled between the second output terminal and the second power supply terminal, the third and fourth FET devices being controlled by a voltage on a respective gate;
switching the gate voltages of the first and second FET devices in response to the first switch control signal so that the first and second FET devices are simultaneously switched, one being switched on and the other being switched off, the first and second FET devices being switched so that as one FET device becomes partially turned off, the other FET device becomes partially turned on, providing a first momentary current path between the first and second power supply terminals, whereby the first and second FET devices are not both off during switching;
switching the gate voltages of the first and second FET devices in response to the second switch control signal so that the third and fourth FET devices are simultaneously switched, one being switched on and the other being switched off, the third and fourth FET devices being switched so that as one FET device becomes partially turned off, the other FET device becomes partially turned on, providing a second momentary current path between the first and second power supply terminals, whereby the third and fourth FET devices are not both off during switching;
wherein the current in the first and second momentary current paths is less than a current that may be delivered through the first and second output terminals to a load connected thereto.

17. The method of claim 16 wherein the slew rate of a voltage on the first output terminal is lower than the slew rate of the first switch control signal.

18. The method of claim 17 wherein the slew rate of a voltage on the second output terminal is lower than the slew rate of the second switch control signal.

19. The method of claim 18 wherein the slew rate of the voltage on the first output terminal is determined by the parameters of a first circuit responsive to the switch control signal to control the gates of the first and second FET devices.

20. The method of claim 19 wherein the slew rate of the voltage on the second output terminal is determined by the parameters of a second circuit responsive to the second switch control signal to control the gates of the third and fourth FET devices.

21. The method of claim 20 wherein the parameters of the first and second circuits include a bias current and a reference current.

22. The method of claim 20 wherein the transition times of voltages on the first and second output terminals are at least 10 ns under all operating conditions.

23. The method of claim 16 wherein the method is practiced using an integrated circuit, and for an inductive load coupled between the first and second output terminals, conduction is always through the FET devices and not through parasitic diodes intrinsic to the FET devices.

24. The method of claim 16 wherein the method is practiced using an integrated circuit, and for an inductive load coupled between the first and second output terminals, conduction is always through the FET devices and not through diodes either internal or external to the integrated circuit.

25. The method of claim 16 further comprised of a speaker coupled between the first and second output terminals.

26. The method of claim 1 wherein the first and second power supply terminals are first and second DC power supply terminals.

27. The method of claim 7 Wherein the first and second power supply terminals are first and second DC power supply terminals.

28. The method of claim 16 wherein the first and second power supply terminals are first and second DC power supply terminals.

29. The method of claim 1 wherein circuitry responsive to the switch control signal limits the current in the momentary current path.

30. The method of claim 7 wherein circuitry responsive to the switch control signal limits the current in the momentary current path.

31. The method of claim 16 wherein circuitry responsive to the switch control signal limits the current in the first and second momentary current paths.

* * * * *